United States Patent [19]

Stout

[11] Patent Number: 4,749,329
[45] Date of Patent: Jun. 7, 1988

[54] DIE PICK MECHANISM FOR AUTOMATIC ASSEMBLY OF SEMICONDUCTOR DEVICES

[75] Inventor: Roger P. Stout, Mesa, Ariz.

[73] Assignee: Motorola, Inc., Schaumburg, Ill.

[21] Appl. No.: 447,078

[22] Filed: Dec. 6, 1982

[51] Int. Cl.$^4$ .............................................. B65G 47/00
[52] U.S. Cl. ................................................... 414/627
[58] Field of Search ............... 414/609, 627; 308/5 R; 198/486

[56] References Cited

U.S. PATENT DOCUMENTS

| | | | |
|---|---|---|---|
| 3,432,213 | 3/1969 | Adams | 308/5 R |
| 3,439,581 | 4/1969 | Wilkins | 308/5 R |
| 3,813,789 | 6/1974 | Shelton | 308/5 R X |
| 3,834,558 | 9/1974 | Bru | 414/627 |
| 3,973,682 | 8/1976 | Neff | 414/627 |
| 4,135,630 | 1/1979 | Snyder et al. | 414/627 |
| 4,266,905 | 5/1981 | Birk et al. | 414/627 |

Primary Examiner—Robert J. Spar
Assistant Examiner—David A. Bucci
Attorney, Agent, or Firm—Joe E. Barbee; Paul F. Wille

[57] ABSTRACT

Automatic assembly equipment for semiconductor devices comprises die or chip selection, transport, and bonding operations coordinated to obtain high production rates. Die selection means comprises a capillary and a needle, positioned on opposite sides of the wafer, which act together to lift the chip out of the plane of the wafer and load the capillary. The transport mechanism comprises a sheave driven carriage for transporting the chip without subjecting the chip to excessive acceleration. The bonding apparatus comprises a slot and gear arrangement for transporting and locating a lead frame and a heater for bonding the chip to the appropriate part of the lead frame.

9 Claims, 3 Drawing Sheets

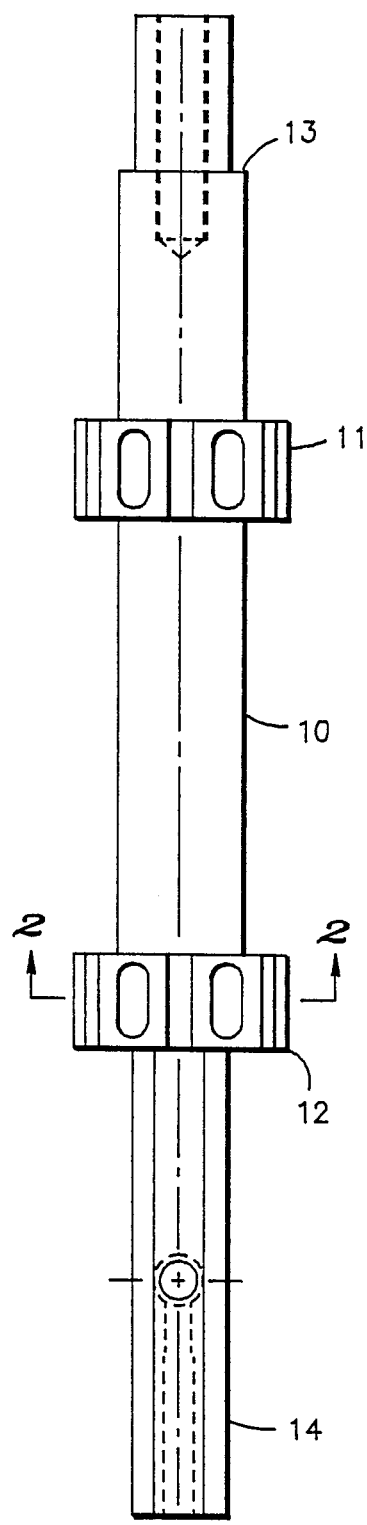
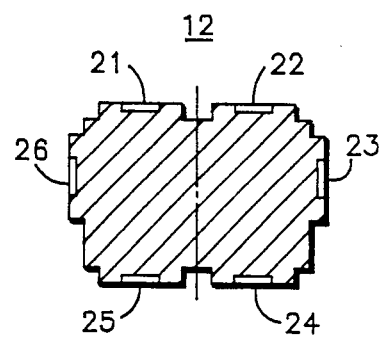
FIG. 2
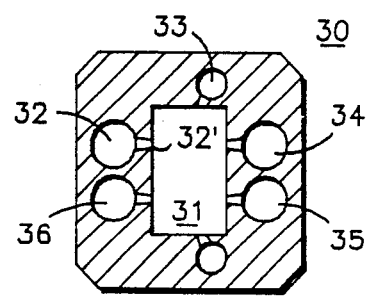
FIG. 3
FIG. 1

DIE PICK MECHANISM FOR AUTOMATIC ASSEMBLY OF SEMICONDUCTOR DEVICES

BACKGROUND OF THE INVENTION

This invention relates to automatic assembly equipment and, in particular, to the automatic assembly of semiconductor devices.

In the past various mechanisms have been used to automatically select a chip from a wafer and transport the chip to a bonding site. Typically an arm comprising a capillary is used to lift the chip by maintaining a slight vacuum in the capillary. While early designs were sufficient to automate, or partially automate, the assembly process, several problems arise as one tries to increase the speed of the equipment. For example, picking a die from a wafer is difficult to do quickly without damaging the die. Typically, a die is selected and held by a capillary or hollow tube or needle having reduced pressure therein, using ambient pressure to hold the die against the end of the capillary. In order to increase the speed at which the die is picked up, one cannot arbitrarily increase the vacuum, i.e. decrease the absolute pressure, in the capillary since at least the surface of the chip will be damaged by contact with the capillary. Worse, the chip can crack under the strain imposed by the capillary.

At the bond site, the die must not only be accurately placed on the lead frame, it must not be placed so heavily as to cause damage. Conversely, it has been found that bonding is erratic if the die are placed too lightly on the lead frame.

Another problem with prior art devices is that the high temperature required at the bond site for certain bonding processes deteriorates the operation of the die pick head. It has been found that the lubricants used deteriorate with temperature such that the capillary cannot move freely within the head, or at least not quickly enough for the assembly rates desired, e.g. greater than four thousand bonds per hour.

SUMMARY OF THE INVENTION

In view of the foregoing, it is therefore an object of the present invention to provide an improved die pick mechanism.

Another object of the present invention is to provide a solenoid actuated die pick mechanism capable of operating at very high die bond rates.

A further object of the present invention is to provide an improved die pick mechanism for operation at widely varying temperatures.

Another object of the present invention is to provide an improved die pick mechanism which places the die on a lead frame with predetermined force to assure that good bonds will be formed consistently.

The foregoing objects are achieved in the present invention wherein a capillary is supported by a shaft attached to the armature of a solenoid. The quill is contained within a case and moves freely within the case, for a limited distance, along the axis of said quill on a plurality of air bearings. The mass of the armature, quill, and capillary are such that the assemblage is permitted to fall freely for a short distance with the die and to impact the lead frame with sufficient, but not excessive, energy to assure consistently good bonds between the die and the lead frame. The die pick mechanism also includes a die ejector mechanism positioned beneath the wafer for assisting in removing die from the wafer.

BRIEF DESCRIPTION OF THE DRAWINGS

A more complete understanding of the present invention can be obtained by considering the following detailed description in conjunction with the accompanying drawings, in which:

FIG. 1 illustrates a preferred embodiment of the quill in accordance with the present invention.

FIG. 2 illustrates an air bearing along the cross-section line 2—2 in FIG. 1.

FIG. 3 illustrates a cross-section of a housing for enclosing the quill in accordance with the present invention.

DETAILED DESCRIPTION OF THE INVENTION

Figure 4:
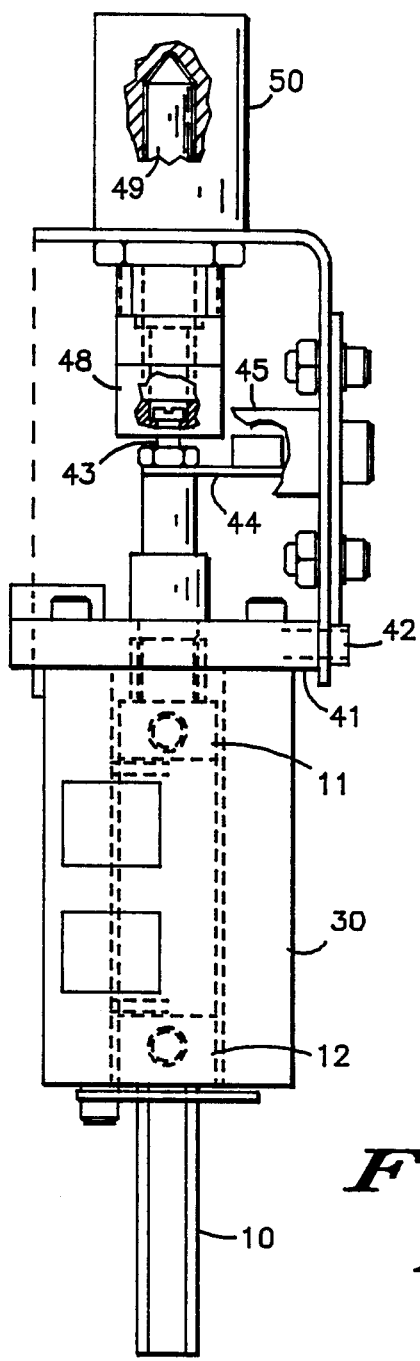
FIG. 4 illustrates an assembled die pick mechanism in accordance with the present invention.

FIG. 1 illustrates in outline detail the quill used for a die pick mechanism in accordance with the present invention. Specifically, quill 10 comprises a shaft or rod having collars 11 and 12 attached thereto. Collars 11 and 12, illustrated in cross-section in FIG. 2, comprise air bearings for positioning quill 10 within the housing illustrated in cross-section in FIG. 3. Collars 11 and 12 can be formed of any suitable material and attached to the shaft of quill 10 by, for example, press fitting or can be formed by turning a large diameter shaft. A first end 13 of quill 10 is preferably adapted to receive a threaded shaft for attachment to a solenoid for moving quill 10 along its axis. The other end, 14, of quill 10 may itself comprise suitable bores for forming a vacuum chuck or, preferably, is suitably adapted for receiving a variety of capillaries of different sizes, chosen in accordance with the size of the die to be transported. Quill 10 may comprise any suitable material, for example, aluminum. The choice of material for quill 10 depends in part on how heavy one wants quill 10 to be.

It is necessary for the die pick mechanism to place the die on the lead frame or, more specifically, on the solder form used to make the die bond, with a predetermined, minimum force to assure consistent die bonds. This force is obtained, in accordance with the present invention, by choosing the mass of the moving elements, i.e. the quill and the armature, and permitting these moving elements to fall freely a predetermined distance. The fall of the moving elements is stopped by the contact of the die with the lead frame. It will be understood that the force, or more correctly, the energy to be supplied by the moving elements will vary in proportion to the area of the die to be bonded. However, the die having an area of $0.225 \times 10^{-3}$ in.$^2$, it has been found that adequate force is imparted to the die if the total mass of the moving elements is approximately twenty grams and the moving elements are permitted to free fall the distance of approximately one thirty-second of an inch. These numbers may vary by up to fifty percent without affecting the quality of the die bond or damaging the die. If desired, additional weight can be added to accommodate larger die. For example, a shoulder at end 13 of quill 10 would serve to hold annular weights.

The problem then presents itself of how to assure the free fall of the moving elements while maintaining control over the position thereof. This problem is solved in accordance with the present invention by forming air bearings with collars 11 and 12. Specifically, as illustrated in FIG. 2, collar 12 comprises a plurality of blind holes 21-26 formed about the periphery thereof. These blind holes form one-half of an air bearing which maintains collars 11 and 12 in suspension within the housing. Since air is the lubricant, the die pick mechanism can operate in severe temperature ambients without quill 10 binding within its housing. While illustrated as rectangular and having six bearing surfaces formed therein, it will be understood by those of skill in the art that collars 11 and 12 may have any desired cross-sectional shape provided that rotation of the quill is prevented. It is also understood by those of skill in the art that the number and location of the air bearing surfaces is determined in part by the cross-sectional shape of collars 11 and 12. The six bearings per collar illustrated in FIG. 1 is preferred since the sides having two bearings each are aligned with the motion of the die transport to provide additional support during acceleration. As illustrated in FIG. 1, each of blind holes 21-26 is elongated along the axis of motion of quill 10, thereby providing support throughout the travel of quill 10.

FIG. 3 illustrates in cross-section the housing in which quill 10 moves. In particular, the cross-section is through the region in which the other portion of the air bearing is provided. In a preferred embodiment of the present invention, housing 30 comprises a plurality of axial bores extending from one end of the housing to a point below the location of lower collar 12. At the correct points along the length of housing 30 there are provided a plurality of nozzles such as nozzle 32'. Each nozzle is positioned corresponding to its respective blind hole. Air or gas is supplied under pressure through bores 32-36. The air or gas is injected into the interior of housing 30 and separates quill 10 from contact with any portion of central chamber 31 within housing 30. The air or gas is exhausted by way of suitable passageways, not shown. Central chamber 31 has the same cross-sectional shape as collars 11 and 12. In operation, quill 10 rides on the air layer formed on each side thereof and can move in what is virtually a friction free environment. Alignment of quill 10 within chamber 31 is assured both by the shape of chamber 31 and the close tolerance which the air bearings enable, for example 3/10,000's of an inch.

FIG. 4 illustrates a complete die pick assembly in accordance with the present invention wherein quill 10 is mounted within housing 30 to which is attached a cap member 41. Cap member 41 preferably comprises a plenum, e.g. an annular groove, communicating with the open ends of bores 32-36 within housing 30. Gas or other air is provided to the plenum by passageway 42. The upper end of quill 10, as illustrated in FIG. 4, is adapted to receive fastening member such as bolt 43. Bolt 43 serves to connect moveable quill 10 with armature 49 of solenoid 50. This is accomplished for example, by collar 48 which is attached to the end of armature 49 and has bolt 43 inserted therein from the upper side. Associated with quill 10 is a position sensing means to provide an output to suitable control apparatus, not shown, indicative of the position of quill 10. In the particular embodiment illustrated in FIG. 4, this sensing means comprises a flag 44, attached to the upper end of quill 10, for intercepting a light path within optical sensor 45. As understood by those of skill in the art, a wide variety of suitable position sensing means can be employed. For example, instead of intercepting a light path, one could monitor the reflection from a particular point on quill 10. Flag 44 is attached to quill 10 by way of bolt 43 and a locknut. Bolt 43 not only connects quill 10 to solenoid 50 but also serves to provide a means for adjusting the spacing between armature 49 and quill 10, thereby providing precise control over the vertical displacement and position of quill 10.

The quill is separated from housing 30 by air bearings formed from collars 11 and 12 as previously described. Collars 11 and 12 can provide an additional function, namely to act as stops for limiting the travel or displacement of quill 10. In actual operation, the contact between the die and the lead frame serves to limit the downward motion of the quill when depositing a die on the lead frame. As previously noted, this displacement, for the particular mass of the quill and armature, is approximately one thirty-second of an inch. Thus, one can provide a safety stop by way of collar 12 by adjusting the interaction of collar 12 with housing 30 such that at least the one thirty-second inch displacement is permitted. Upward displacement of quill 10 is limited by collar 48.

Figure 5:
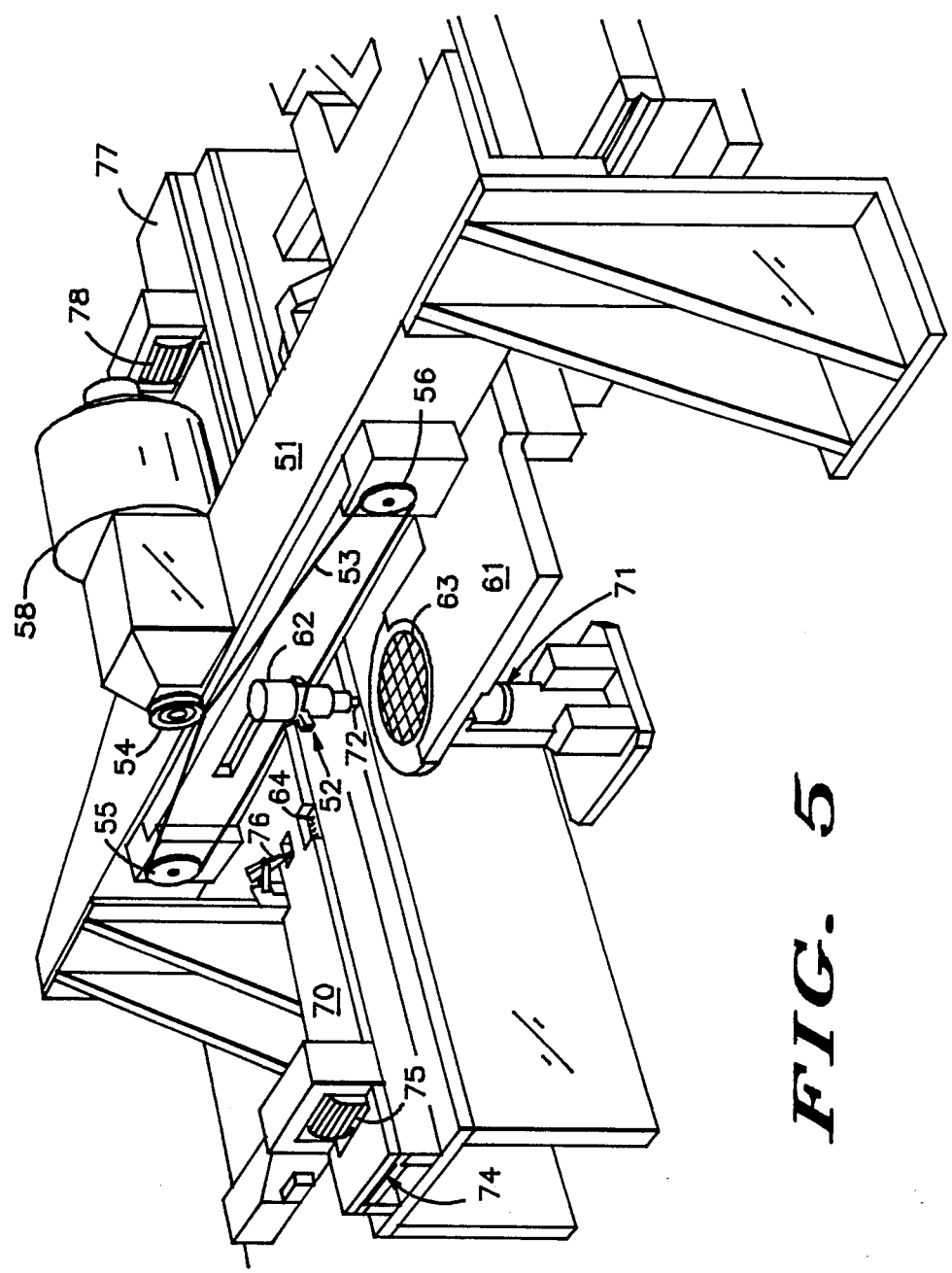
FIG. 5 illustrates a complete die bond station using the die pick mechanism of the present invention.

FIG. 5 illustrates a preferred embodiment of the present invention wherein the die pick mechanism is mounted on a carriage which traverses the space between an x-y table containing a semiconductor wafer and a lead frame die bond apparatus. Specifically, die bond apparatus in accordance with the present invention comprises track 51 having shuttle 52 mounted thereon. Shuttle 52 is attached to belt 53 which passes through sheaves or pulleys 54, 55, and 56. Sheaves 55 and 56 are idler sheaves while sheave 54 is a drive sheave connected to motor 58.

Shuttle 52, sheaves 54, 55, and 56, and motor 58 are mounted on a suitable frame which, in the embodiment illustrated in FIG. 5, straddles x-y table 61 and lead frame drive 70. X-y table 61 is well known per se in the art and any suitable x-y table can be used in the present invention. Table 61 serves to move wafer 63 beneath chuck 62 so that each functional die from wafer 63 may be picked up by chuck 62 and transferred to lead frame apparatus 70. Lead frame apparatus 70 comprises slot 74 into which a strip of lead frames is inserted and advanced by gear 75. Lead frame apparatus 70 comprises a die bonding area 64 located along the path taken by shuttle 52. In operation, chuck 62 of shuttle 52 picks up a die from wafer 63, transports it across to die bond area 64, releases the die, and then returns to x-y table 61 to obtain another die. In the meantime, x-y table 61 has repositioned itself so that another die from wafer 63 is available at the predetermined point to which shuttle 52 returns. Lead frame apparatus 70 can comprise suitable lead frame locating apparatus 76 for insuring that the die bond area of the lead frame is accurately located with respect to bonding site 74. After being placed on the lead frame, the lead frame and die are bonded, e.g. by soldering. The lead frame is then advanced by drive gears 75 and 78 while shuttle 52 returns to wafer 63 for another die.

In a preferred embodiment of the present invention the die pick mechanism comprises two actuators, one comprising the die pick mechanism illustrated in FIGS. 1-4, and the other comprising a simpler actuation for pushing a needle up from beneath wafer 63 to raise the die, thereby facilitating a capture of the die by the chuck formed by or attached to quill 10. Actuator 71 is fixed and the position thereof defines the end position for the moveable actuator comprising die chuck 72.

Actuator 71 may comprise a solenoid similar to that illustrated in FIG. 4 or may comprise a suitable stepper mechanism for variably raising the die to preselected heights to assure capture by die chuck 72.

There is thus provided by the present invention an improved die pick mechanism capable of operating at high speed in hostile ambients. Despite the speed of the die pick mechanism, the design thereof assures that the individual die will be sufficiently gently handled that they are not damaged during the pick up, or transport, or bonding operations. Further the bonding operation is enhanced by placing the die on the lead frame with a predetermined minimum force to assure a good bond between the die and the lead frame.

Having thus described the invention, it will be apparent to those of skill in the art that various modifications can be made within the spirit and scope of the present invention. For example, as previously noted, the end of quill 10 can be adapted to act as the vacuum chuck for the die or, preferably, is adapted for receiving one of a plurality of vacuum chucks, chosen to accommodate the particular die area in question. Similarly, while the collars can be used as displacement stops, one may prefer to machine a shoulder into quill 10 to provide the same function. Also, while preferably in axial alignment with quill 10, solenoid 50 may be displaced therefrom and connected to quill 10 by suitable linkage.

I claim:

1. A pick mechanism comprising:
   a quill of predetermined mass and having a first end adapted to hold an article;
   a solenoid having the armature thereof connected to the other end of said quill, said armature also having a predetermined mass;
   a housing enclosing said quill for coupling said quill to a support;
   air bearing means interposed between said quill and said housing for enabling said quill to fall freely in an axial direction; and
   wherein said quill and said armature can apply said article to a surface with a force determined by their masses and the distance of free-fall.

2. The pick mechanism as set forth in claim 1 wherein said quill is adapted to receive additional mass.

3. The pick mechanism as set forth in claim 1 wherein said pick mechanism further comprises:
   means for sensing the position of said quill within said housing.

4. The pick mechanism as set forth in claim 1 wherein said air bearing means comprises a collar having blind holes in the outer surface thereof.

5. The pick mechanism as set forth in claim 4 wherein said blind holes are elongated in the direction of travel of said quill.

6. The pick mechanism as set forth in claim 5 wherein said housing comprises gas passageways aligned with said blind holes.

7. The pick mechanism as set forth in claim 1 and further comprising:
   a chuck attached to the first end of said quill.

8. The pick mechanism as set forth in claim 7 wherein said chuck comprises a vacuum chuck.

9. The pick mechanism as set forth in claim 8 wherein said vacuum chuck comprises a capillary.

* * * * *